United States Patent

Kyrian et al.

[11] Patent Number: 5,166,631
[45] Date of Patent: Nov. 24, 1992

[54] CIRCUIT FOR REGENERATION AND BANDWIDTH LIMITATION OF A QUASI-PERIODIC DIGITAL SIGNAL

[75] Inventors: Bohumi Kyrian, Unterbözberg, Switzerland; Sippo L. Sääski, Pori; Jukka T. Vermasvuori, Vantaa, both of Finland

[73] Assignee: Asea Brown Boveri Ltd., Baden, Switzerland

[21] Appl. No.: 801,055

[22] Filed: Dec. 3, 1991

[30] Foreign Application Priority Data

Dec. 8, 1990 [EP] European Pat. Off. ........ 90123658.8

[51] Int. Cl.$^5$ ............................ H03K 5/00; H03L 7/00
[52] U.S. Cl. .................................. 328/164; 307/269; 307/273; 328/63
[58] Field of Search ................. 328/164, 111, 63, 72; 307/234, 269, 273, 518, 265, 268

[56] References Cited

U.S. PATENT DOCUMENTS

| | | | |
|---|---|---|---|
| 4,417,213 | 11/1983 | Ito | 328/164 |
| 4,823,360 | 4/1989 | Tremblay et al. | 328/164 |
| 4,857,760 | 8/1989 | Stuebing | 307/234 |

FOREIGN PATENT DOCUMENTS 0193655 8/1989 European Pat. Off.
0360990 4/1990 European Pat. Off.

*Primary Examiner*—Janice A. Howell
*Assistant Examiner*—Toan Tran
*Attorney, Agent, or Firm*—Oblon, Spivak, McClelland, Maier & Neustadt

[57] ABSTRACT

A circuit for regeneration and bandwidth limitation of a quasi-periodic digital input signal. By controlled alternating internal triggering of two monoflops utilizing feedback or external triggering of the two monoflops by means of the input signal, erratic pulses are reliably suppressed, bypass pulses are delivered without time delay and frequencies outside a preset band are not transmitted.

11 Claims, 3 Drawing Sheets

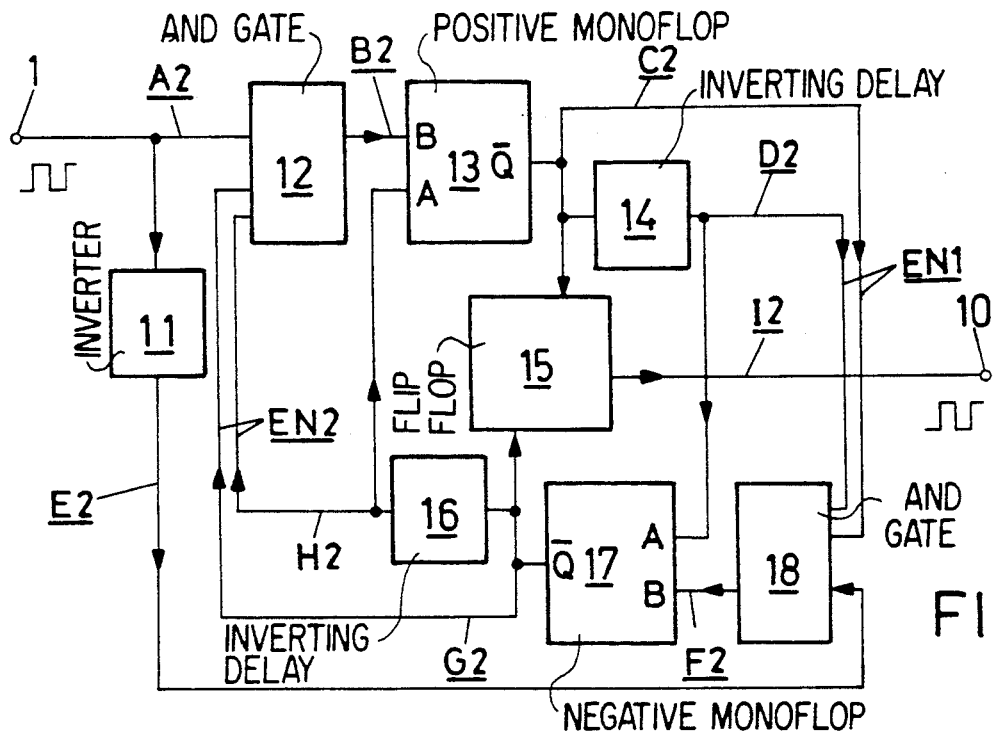
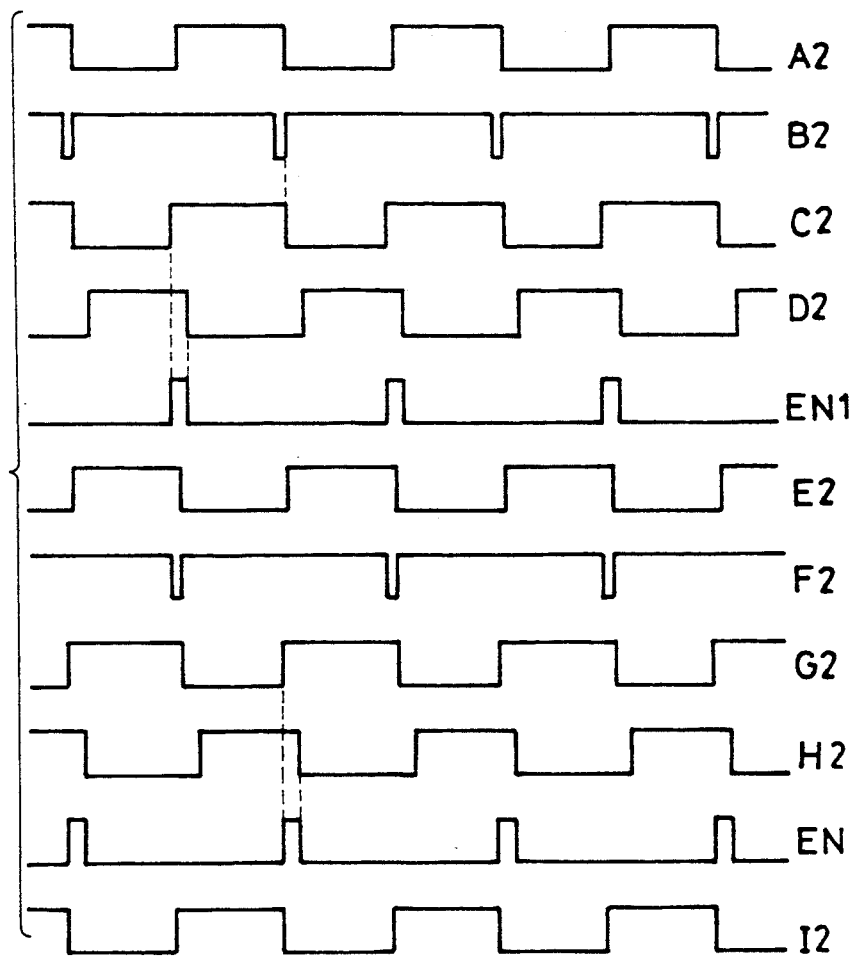
FIG.3
FIG.4

CIRCUIT FOR REGENERATION AND BANDWIDTH LIMITATION OF A QUASI-PERIODIC DIGITAL SIGNAL

BACKGROUND OF THE INVENTION

1. Field of the Invention

This invention relates to the field of signal electronics, and more particularly relates to a circuit for regeneration and bandwidth limitation of a quasi-periodic digital signal.

2. Discussion of the Background

In the field of radio, SSB (single side band) transmitters or ISB (independent side band) transmitters are used, which operate according to the process of "envelope elimination and restoration" (EER) (see, for this purpose EP-B1-0 193 655 or EP-A1-0 360 990).

In this process, first a produced SSB or ISB signal is divided into an amplitude signal and a phase signal. The two signals are then separately amplified and again combined into an HF final stage.

In this case, the phase signal is preferably a digital, quasi-periodic FM signal with an average frequency of about 200 kHz. In certain operating states of the transmitter this phase signal can temporarily fade, can be unstable in its phase, or be superposed by stray pulses, which leads to impairments of the transmission quality of the transmitter.

To avoid such impairments a circuit is necessary by which, on the one hand, the phase signal is regenerated without time delay and, on the other hand, can be limited in its bandwidth to about ±15 kHz.

It is now generally known to regenerate weak and disturbed signals with the help of a so-called PLL (phase locked loop) circuit. In this case, temporarily defective or undefinable (erratic) oscillations are by-passed or replaced by a voltage-controlled oscillator (VCO).

But such a solution has the drawback that the PLL circuit because of its unavoidable time constants, after each case of disturbance requires a relatively long time in each case to lock in position again. If, at the same time, a bandwidth limitation of the signal to be regenerated is necessary, the PLL circuit because of the great difference between the holding range and lock-in range and the necessary time constants can not be used at all.

SUMMARY OF THE INVENTION

Accordingly, the object of this invention is to provide a new and improved circuit by which a digital, quasi-periodic signal can be generated without delay and be limited in its bandwidth.

The above object is achieved according to the present invention by providing a novel circuit of the initially mentioned type, including:

(a) a signal input for the signal to be regenerated and a signal output for the regenerated signal;

(b) a flip-flop having two trigger inputs and an output connected to the signal output;

(c) at least one controllable gate controlled by an enable signal having an input connected to the signal input and an output;

(d) a monoflop (i.e., monostable (one-shot) multivibrator), triggerable by a positive edge, and having at least one trigger input connected to the output of the controllable gate and one output in operative connection with the first trigger input of the flip-flop;

(e) a negative monoflop, triggerable by a negative edge, having at least one trigger input connected to the output of the gate and one output in operative connection with the second trigger input of the flip-flop;

(f) a first circuit placed between the outputs of the positive monoflop and the negative monoflop and the controllable gate for producing the enable signal; and (g) a second circuit for internal triggering of the positive monoflop and the negative monoflop if the triggering edges of the period signal on the signal input fail.

A first preferred embodiment of the circuit according to the invention is distinguished in that, (a) the positive monoflop and the negative monoflop each have only one trigger input and the output of the positive monoflop is an inverted output;

(b) the controllable gate is designed as a latch with an input, an output and a control input for the enable signal, and the input of the latch is in operative connection with the signal input and output of the latch with the trigger input of each of the positive and negative monoflops;

(c) the first circuit includes an AND gate with two inputs and one output, with the first input of the AND gate connected to the output of the positive monoflop, the second input of the AND gate connected to the output of the negative monoflop and the output of the AND gate connected to the control input of the latch; and (d) the second circuit includes a retriggerable monoflop with an input and an output, a start-stop oscillator with a control input and an output, and an exclusive OR gate with two inputs and one output, wherein the input of the retriggerable monoflop is connected to the output of the AND gate, the output of the retriggerable monoflop is connected to the control input of the start-stop oscillator, the output of the start-stop oscillator is connected to a first input of the exclusive OR gate, the second input of the exclusive OR gate is connected to the signal input and the output of the exclusive OR gate is connected to the input of the latch.

A second preferred embodiment of the circuit according to the invention includes, (a) the positive monoflop and the negative monoflop each having two trigger inputs and an inverted output;

(b) two controllable gates in the form of two NAND gates each provided with three inputs and one output;

(c) the first input of the first NAND gate connected to the signal input and the output of the first NAND gate connected to the first trigger input of the positive monoflop;

(d) the first input of the second NAND gate connected by an inverter to the signal input and the output of the second NAND gate connected to the first trigger input of the negative monoflop;

(e) the first circuit including two inverting delay circuits, and the third input of the second NAND gate connected by the first inverting delay circuit to the output of the positive monoflop and the third input of the first NAND gate connected by the second inverting delay circuit to the output of the negative monoflop;

(f) the second input of the first NAND gate connected to the output of the negative monoflop and the second input of the second NAND gate connected to the output of the positive monoflop; and (g) the second circuit providing a feedback path between the two monoflops by the two inverting delay circuits, and the output of the positive monoflop connected by the first inverting delay circuit to the second trigger input of the negative monoflop and the output of the negative monoflop connected by the second inverting delay circuit to the second trigger input of the positive monoflop.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3 is a block diagram of a second embodiment of a circuit according to the invention with ring oscillator formed by two monoflops and two delay circuits;

FIG. 4 is a timing diagram illustrating different pulse trains occurring in the normal operation of the circuit according to FIG. 2.

DESCRIPTION OF THE PREFERRED EMBODIMENTS

Figure 1:
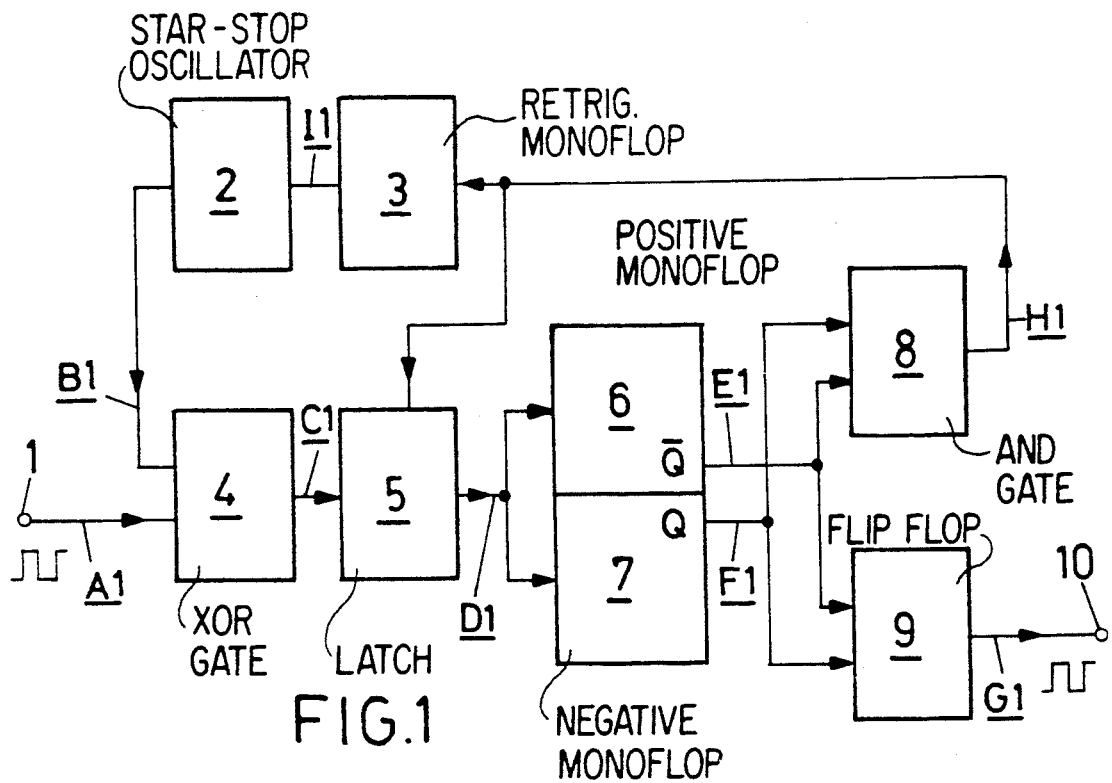
FIG. 1 is a block diagram of a first embodiment of a circuit according to the invention with a retriggerable monoflop as a time-determining element.

Referring now to the drawings, wherein like reference numerals designate identical or corresponding parts throughout the several views, three embodiments of the regeneration circuit according to the invention are next explained in design and function.

The block diagram of the first of the three embodiments is reproduced in FIG. 1. An exclusive OR gate 4 with 2 inputs, a latch 5, two parallel monoflops 6 and 7 as well as a flip-flop 9 with two inputs are placed after one another between input 1 and output 10 in this circuit. First monoflop 6 is a positive monoflop, which is triggered by a positive edge. Second monoflop 7 is a negative monoflop, which is triggered by a negative edge.

The one input of exclusive OR gate 4 is connected to input 1 of the circuit. The output of latch 5 is connected to one input each of the two monoflops 6 and 7. Positive monoflop 6 is connected by an inverted output and negative monoflop 7 is connected by a noninverted output to one each of the inputs of flip-flop 9. The output of flip-flop 9 is connected to output 10 of the circuit.

The outputs of monoflops 6 and 7 are connected to a respective input of an AND gate 8, whose output is brought back to another input of the exclusive OR gate 4 by a retriggerable monoflop 3 and a start-stop oscillator 2. Moreover, the output of AND gate 8, on which an enable signal appears, is connected to the control input of latch 5.

The parameters of the three monoflops 3, 6 and 7 as well as of start-stop oscillator 2 conform to the average frequency of the signal to be regenerated and the preset bandwidth. For the explanation of the mode of operation of the circuit according to FIG. 1 it can be assumed that the signal to be regenerated is the initially mentioned phase signal of a SSB or ISB transmitter with a frequency of 200 kHz, whose bandwidth is to be limited to ±15 kHz.

In this case, the period is 5 microseconds, the period of a half-period correspondingly to 2.5 microseconds. The two monoflops 6 and 7 then have an operating time each of 2.3 microseconds, retriggerable monoflop 3 has an operating time of 2.7 microseconds, and start-stop oscillator 2 has a natural frequency, which preferably is 10 times the signal frequency, i.e., about 2 MHz.

The highest frequency, which is transmitted by the circuit, is determined by the operating time of the two monoflops 6 and 7 (in the example discussed in this case it is $T^{-1}=(2(2.3))^{-1}\times 10^6$ s$^{-1}$ approximately=215 kHz). On the other hand, the operating time of retriggerable monoflop 3 establishes the lowest frequency (in the example this is $T^{-1}=(2(2.7))^{-1}\times 10^6$ s$^{-1}$ approximately=185 kHz).

Figure 2:
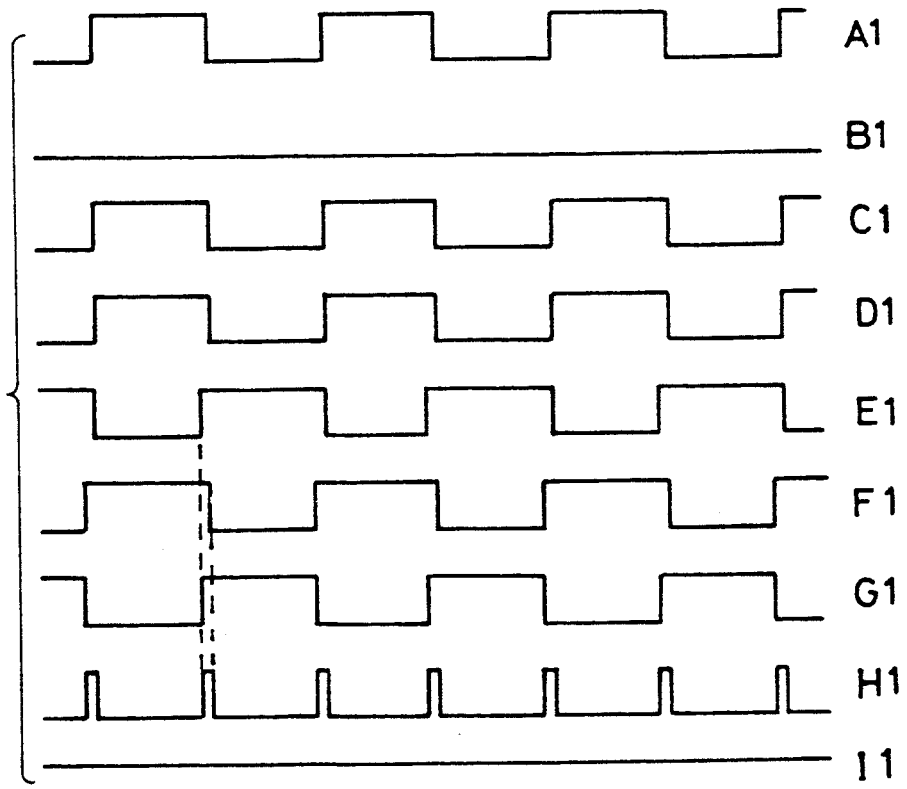
FIG. 2 is a timing diagram illustrating different pulse trains occurring in the normal operation of the circuit according to FIG. 1.

The function of the circuit according to FIG. 1 is the following (for the normal case of pulse trains which occur at different points of the circuit identified in FIG. 1 by A1 to I1 represented in FIG. 2): In the normal case, if the frequency is within the preset bandwidth, rectangular signal (A1), applied to input 1, to be regenerated is passed to the two monoflops 6 and 7 without change (C1, D1). There a pulse, 2.3 microseconds long, each (E1, F1) is started separately at the positive as well as the negative edge. These pulses trigger flip-flop 9 so that on its output and thus on output 10 of the circuit the regenerated signal appears in the same form as on input 1 (G1).

By AND gate 8, after operation of each of the two monoflops 6 and 7, an enable signal (H1) each results, whose period normally is 200 ns, but at most can reach the difference between the pulse lengths of monoflops 6 and 7 and retriggerable monoflop 3. With this enable signal latch 5 is opened for the next trigger edge and at the same time retriggerable monoflop 3 is started. Since the next edge in the normal case comes to input 1 before the operating time of monoflop 3, the latter is again and again triggered anew in each half-period, and its output remains inactive (I1), i.e., start-stop oscillator 2 is not started (B1).

Now if the input signal fails to appear (whether at logical "1" or logical "0") or if the input frequency is too low, the circuit from FIG. 1 in a way makes an "equivalent" signal available. In this case retriggerable monoflop 3 functions and starts start-stop oscillator 2. By this first half-wave the output level on the exclusive OR gate is inverted. The related edge triggers—depending on its polarity—the corresponding one of the two monoflops 6 and 7 in the same way as if it came from input 1, but with a period, which is determined by the operating time of retriggerable monoflop 2 (2.7 microseconds). This means that when a signal fails to appear on output 1, a periodic "equivalent" signal with the lowest possible frequency (in the present example 185 kHz) appears at output 10.

In this case, if exclusive OR gate 4 should be prevented from inverting by a simultaneously arriving input pulse, start-stop oscillator 2 continues to oscillate until one of the two monoflops 6 and 7 triggers. In this way, the enable signal becomes inactive and start-stop oscillator 2 is stopped by retriggerable monoflop 3.

On the other hand, if the frequency of the signal applied at input 1 is too high (in the present example more than 215 kHz), the next edge does not come through latch 5 as early since the enable signal is still inactive. Neither of the two monoflops 6 and 7 can thus be triggered, until the time of the other one (started by the preceding edge) has expired.

As long as no edge from input 1 falls into the time window between the two timing periods of monoflops 6 or 7 and 3, every next half-period of the output signal is again determined by retriggerable monoflop 3, and again the lowest possible frequency appears on output 10.

The block diagram of the second of the three embodiments is reproduced in FIG. 3. In this case also, as with the circuit of FIG. 1, various switching points are identified by the references A2 to I2, at which in normal operation, i.e., with an input signal with the desired frequency, the pulse trains, represented in FIG. 4, occur. Enable signals are identified by EN1 and EN2, which result from the logic AND operations of signals C2, D2 or G2, H2 each.

The circuit itself includes, between input 1 and output 10, an inverter 11, two NAND gates 12 and 18, positive monoflop 13, negative monoflop 17 (negative), two delay circuits 14 and 16 with additional signal inversion as well as a flip-flop 15.

From input 1 the signal gets directly to an input of first NAND gate 12, and by inverter 11 to an input of second NAND gate 18. Two other inputs of first NAND gate 12 are connected to the output of second delay circuit 16 or to the inverted output of negative monoflop 17, which is triggered by negative edges. Two other inputs of second NAND gate 18 are correspondingly connected to the output of first delay circuit 14 or the inverted out of positive monoflop 13, which is triggered by positive edges.

The output of first NAND gate 12 is connected to input B of positive monoflop 13, the output of second NAND gate 18 is connected to input B of negative monoflop 17. A second input A of positive monoflop 13 is connected to the output of second delay circuit 16, a second input A of negative monoflop 17 is connected to the output of first delay circuit 14. From the inverted output of positive monoflop 13 lines lead to the input of first delay circuit 14 and to a first input of flip-flop 15. From the inverted output of negative monoflop 17 lines lead to the input of second delay circuit 16 and to a second input of flip-flop 15. The output of flip-flop 15 finally leads to output 10 of the circuit.

The two monoflops 13 and 17 together with delay circuits 14 and 16 form a ring oscillator, whose period is determined by the sum of the times of their four function groups. The period corresponds in this case to the lowest possible frequency at output 10 of the circuit. This frequency is produced, if the input signal fails and no outside triggering can shorten the periods.

For an average frequency of the signal to be regenerated of 200 kHz, the two monoflops 13 and 17 again have an operating time of 2.3 microseconds. They thus generate the basic half-periods, which determine the highest possible output frequency. Delay circuits 14 and 16, for their part, exhibit a delay time 0.4 microseconds each.

The differences between the shortest (C2, G2) and the longest (D2, H2) half-periods form in NAND gates 12 and 18 the related enable signals (EN1 and EN2) for the triggering edges of the input signal—in NAND gate 12 for the positive edges and in NAND gate 18, after inverter 11, for the negative edges.

So that a failure of the triggering with the simultaneous occurrence of trigger edges on the two inputs A and B of each monoflops 13 and 17 is definitely avoided, trigger inputs A in each case are slightly delayed with RC elements (not drawn in, in FIG. 3). As a result it is achieved that the triggering by these inputs can take place only after blocking of NAND gate 12 or 18 by the enable signal (EN2 or EN1).

At frequencies of the input signal within the preset bandwidth the two monoflops 13 and 17 are triggered with the positive or negative edges on inputs B alternately within the respective time window determined by the enable signal. That slightly later (delayed by delay circuits 14 and 16) in each case a trigger pulse comes to input A is insignificant, since the two monoflops 13 and 17 cannot be retriggered.

The output signal is finally formed by flip-flop 15, as in the first embodiment of FIG. 1, which alternately is triggered by the two monoflops 13 and 17.

Figure 5:
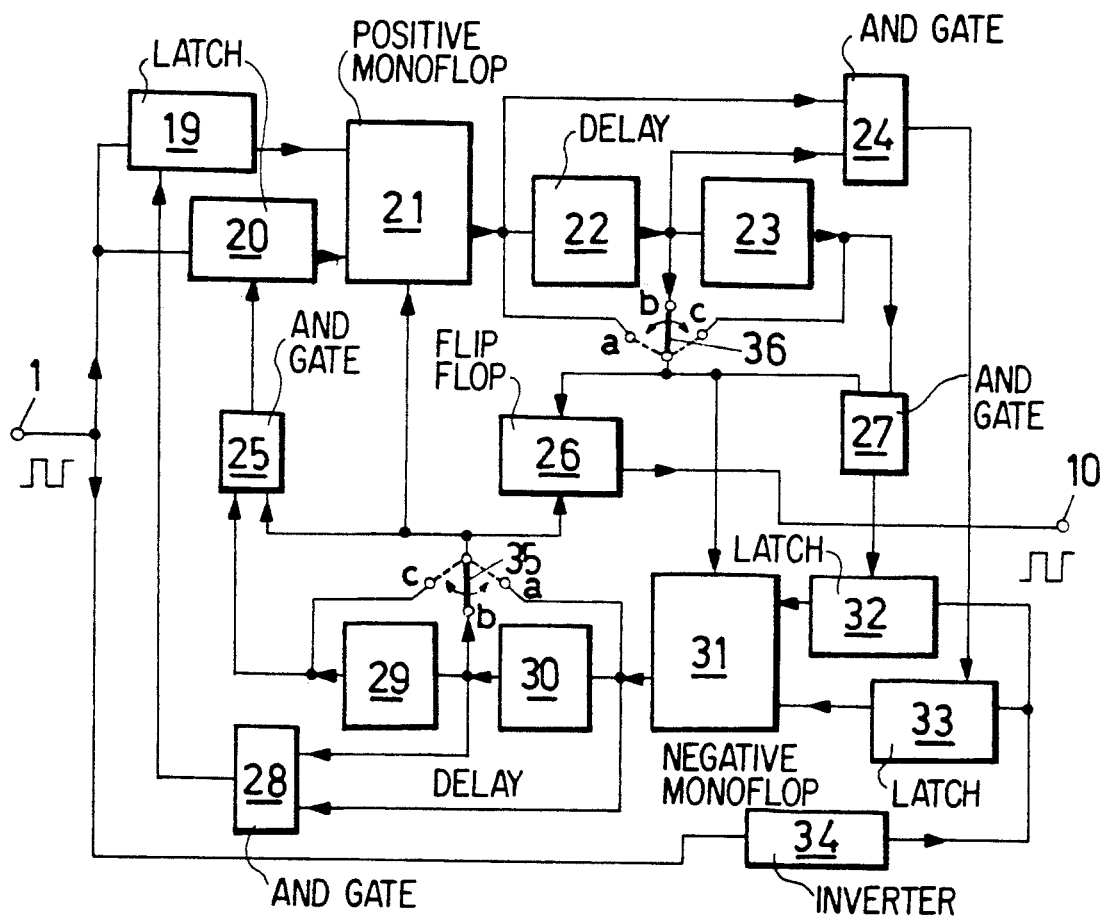
FIG. 5 is a block diagram of a third embodiment of a circuit according to the invention with a ring oscillator, reversible in frequency, formed by two monoflops and four selectable delay circuits.

A broadened variation of the embodiment represented in FIG. 3 is represented as third embodiment in FIG. 5. Central elements of the circuit are again positive monoflop 21 and negative monoflop 31 connected in a ring oscillator arrangement (operating time of the two monoflops according to the example: 2.3 microseconds each), as well as a flip-flop 26, which forms the output signal and is connected with its output to output 10 of the circuit. Monoflop 21 here, too, reacts to positive edges, monoflop 31 correspondingly reacts to negative edges.

In case of failure of the input signal the bypass frequency produced by the circuit, which in the embodiments so far described in each case always corresponded to the lowest possible frequency, in the embodiment according to FIG. 5 can be switched between several values (the lowest possible $f_{min}$, average $f_{average}$ and the highest possible $f_{max}$).

For this purpose, first the two monoflops 21 and 31 are designed retriggerable, so that a prolongation of the basic period becomes possible. Moreover, at the output of each of monoflops 21 and 31 two similar delay circuits 22, 23 or 30, 29 are placed behind one another (delay time according to the example: 0.2 microseconds each), which can alternately be cut into the ring oscillator circuit by related changeover switch 36 or 35.

Each of the two changeover switches exhibits three switch positions "a", "b" and "c". In switch position "a" the output of one monoflop is looped back directly to a triggering input of the other monoflop, without one of delay circuits 22, 23 or 29, 30 being interposed. The period of the natural oscillation produced by the ring oscillator in the failure of an input signal in this case is double the turn-on time of monoflops 21 and 31. At the same time, the related frequency is the highest possible frequency $f_{max}$. The outputs of monoflops 21 and 31 at the same time are connected to the related inputs of flip-flop 26, so that the signal delivered at output 10 also occurs with frequency $f_{max}$.

In switch position "b" a first delay 22 or 30 each is connected between monoflops 21 and 31 and thus the half-period of the natural oscillation is prolonged by the delay time of these delays. The produced frequency is then equal to the average frequency $f_{average}$.

Finally, in switch position "c", two delays 22 and 23 or 29 and 30 each are connected between monoflops 21 and 31. The half-period of the natural oscillation in this case is prolonged by the doubled delay time, so that at output 10 the lowest frequency $f_{min}$ appears.

The different natural frequencies adjustable with changeover switches 35 and 36 are then important as bypassing frequencies if the signal to be regenerated on input 1 fails or with its frequency is below the preset passband. On the other hand, in the normal case the edges of the input signal are used, as in the other embodiments, to trigger or retrigger monoflops 21 and 31.

For this purpose, input 1 is connected by a first latch 19 to another trigger input and by a second latch 20 to a retrigger input of positive monoflop 21. The corresponding connections from input 1 to another trigger input and to a retrigger input of negative monoflop 21 take place by an inverter 34 and latches 33 or 32.

Latches 19 or 33, placed in front of the trigger inputs, are each controlled by first enable signals, which respectively are produced by first AND gates 28 and 24, each having two inputs respectively connected to the input and output of delay circuit 30 or the delay circuit 22. Latches 20 or 32, placed in front of the retrigger inputs, are controlled by second enable signals, respectively produced by second AND gates 25 or 27. And gate 25 has one input connected to the output of second delay circuit 29 and an other input connected to the output of changeover switch 35. And gate 27 has one input connected to the output of second delay circuit 23, and an other input connected to the output of changeover switch 36.

The trigger edges of the input signal are optionally conducted by the two enable signals to trigger or retrigger monoflops 21 and 31, depending on whether the basic period is to be shortened or prolonged.

It goes without saying that the average frequency and the bandwidth of the arrangement, deviating from the explained example (200 kHz±15 kHz) can largely be selected in any way, by the turn-on times of the monoflops used and the delay times of the delay circuits used being correspondingly matched.

Further, it is unnecessary to represent the inner design of the individual circuit blocks, since these blocks as standard components are known to one skilled in the field of signal electronics. In this connection reference can be made, e.g., to the publication "Das TTL-Kochbuch" [The TTL Cookbook] of Texas Instruments Deutschland GmbH, D-8050 Freising (1972), in which numerous examples for the various function blocks used in this case are reproduced.

Viewed at as a unit, the proposed digital circuit, seen from the outside, works in the similar way as a PPL circuit, but contains none of the disadvantageous closed loops. After a case of disturbance, the circuit immediately again occupies the correct phase at the first zero crossing of the signal, in the selected period window. It does not react to any pulses, which are outside the set period window. Also there is no difference between the holding range and lock-in range, and no delays by times constants.

The output frequency can vary only between two preset values, $f_{min}$ and $f_{max}$. Thus also the bandwidth of an FM signal is clearly limited. Similarly, no erratic pulses can occur at the output of the circuit. According to a preferred embodiment, the circuit can be designed so that the bypassing frequency is either at $f_{min}$, $f_{max}$ or at $f_{average}$.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. Circuit for regeneration and bandwidth limitation of a quasi-periodic digital signal having triggering edges, comprising:
   a signal input for receiving the digital signal to be regenerated and a signal output for outputting a regenerated signal;
   a flip-flop having an output and first and second trigger inputs, the output of said flip-flop connected to the signal output;
   at least one controllable gate controlled by an enable signal and having an input coupled to said signal input and an output;
   a positive monoflop triggerable by a positive edge and having at least one trigger input and an output, the output of said positive monoflop being in operative connection with the first trigger input of said flip-flop;
   a negative monoflop triggerable by a negative edge and having at least one trigger input and an output, the output of said negative monoflop being in operative connection with the second trigger input of said flip-flop, said signal input being coupled to said at least one trigger input of both said positive monoflop and said negative monoflop via the signal input and the output of said at least one controllable gate;
   first means responsive to the outputs of said positive monoflop and said negative monoflop for producing the enable signal; and
   second means coupled between said first means and said controllable gate for internal trigger of said positive monoflop and said negative monoflop when the triggering edges of the digital signal received on said signal input fail.

2. Circuit according to claim 1, comprising:
   said positive monoflop and said negative monoflop each having only one trigger input and the output of said positive monoflop being an inverted output;
   said at least one controllable gate comprising a latch having an input, an output and a control input for the enable signal, wherein the input of latch is coupled to the signal input and the output of latch is connected to the trigger input of each of said positive monoflop and said negative monoflop;
   said first means comprising an AND gate having two inputs and one output, wherein the first input of said AND gate is connected to the output of said positive monoflop, the second input of said AND gate is connected to the output of said negative monoflop and the output of said AND gate is connected to the control input of said latch; and
   said second means comprising a retriggerable monoflop having an input and an output, a start-stop oscillator having a control input and an output, and an exclusive OR gate having two inputs and one output, wherein the input of said retriggerable monoflop is connected to the output of said AND gate, the output of said retriggerable monoflop is connected to the control input of said start-stop oscillator, the output of said start-stop oscillator is connected to the first input of said exclusive OR gate, the second input of said exclusive OR gate is connected to the signal input, and the output of said exclusive OR gate is connected to the input of said latch.

3. Circuit for regeneration and bandwidth limitation of a quasi-periodic digital signal having triggering edges, comprising:
   a signal input for receiving the digital signal to be regenerated and a signal output for outputting a regenerated signal;
   a flip-flop having an output and first and second trigger inputs, the output of said flip-flop connected to the signal output;
   first and second NAND gates each having first through third inputs and one output, the first input of the first NAND gate connected to the signal input and the first input of the second NAND gate connected via an inverter to the signal input;
   a positive monoflop triggerable by a positive edge and having a first trigger input connected to the output of said first NAND gate, a second trigger input and an output, the output of said positive monoflop being in operative connection with the first trigger input of said flip-flop;
   a negative monoflop triggerable by a negative edge and having a first trigger input connected to the output of said second NAND gate, a second trigger input and an output, the output of said negative monoflop being in operative connection with the second trigger input of said flip-flop, the second input of said first NAND gate connected to the output of said negative monoflop ad the second input of said second NAND gate connected to the output of said positive monoflop;
   first and second inverting delay circuits, responsive to the outputs of said positive monoflop and said negative monoflop, respectively, the output of said positive monoflop connected via said first inverting delay circuit to the third input of said second NAND gate and the output of said negative monoflop connected via said second inverting delay circuit to the third input of said first NAND gate;
   a feedback path between the positive and negative monoflops, including said first and second inverting delay circuits, the output of said positive monoflop connected via said first inverting delay circuit to the second trigger input of said negative monoflop and the output of said negative monoflop connected via said second inverting delay circuit to the second trigger input of said positive monoflop, said feedback path providing an internal trigger of said positive monoflop and said negative monoflop when the triggering edges of the digital signals received on said signal input fail.

4. Circuit for regeneration and bandwidth limitation of a quasi-periodic digital signal having triggering edges, comprising:
   a signal input for receiving the digital signal to be regenerated and a signal output for outputting a regenerated signal;
   a flip-flop having an output and first and second trigger inputs, the output of said flip-flop connected to the signal output;
   first through fourth latches each having an input, an output and a control input;
   a retriggerable positive monoflop triggerable by a positive edge and having first and second trigger inputs, an output and a retrigger input;
   a retriggerable negative monoflop triggerable by a negative edge and having first and second trigger inputs, an output and a retrigger input;
   the inputs of said first and second latches connected to the signal input, the output of the first latch connected to the first trigger input;
   the inputs of the third and fourth latches connected via an inverter to the signal input, the output of the fourth latch connected to the first trigger input of the negative monoflop and the output of third latch connected to the retrigger input of the negative monoflop;
   first means responsive to the outputs of said positive monoflop and said negative monoflop for producing enable signals applied to the control inputs of said first through fourth latches, comprising,
   first through fourth delay circuits, first through fourth AND gates each having first and second inputs and an output, and first and second changeover switches each having first through third switch positions, wherein the first and second delay circuits are connected in series between the output of the positive monoflop and the first input of the third AND gate; and the third and fourth delay circuits are connected in series between the output of the negative monoflop and the first input of the second AND gate; and the first and second inputs of the first and fourth AND gates are respectively connected to the input and output of the first and third delay circuits, and the outputs of the first and fourth AND gates are respectively connected to the control inputs of the fourth and first latches, the fist changeover switch in the three switch positions selectively connects the output of the negative monoflop or the output of fourth delay circuit or the output of the third delay circuit to the second input of the second AND gate and to the second trigger input of the flip-flop, the second changeover switch in the three switch positions selectively connects the output of the positive monoflop or the output of first delay circuit or the output of second delay circuit to the second input of the third AND gate and to the first trigger input of the flip-flop, and the outputs of the second and third AND gates are respectively connected to the control inputs of the second and third latches; and
   a feedback path between the positive and negative monoflops for producing internal trigger signals applied to the second trigger input of said positive monoflop and the second trigger input of said negative monoflop when the triggering edges of the digital signal received on said input fail, comprising the output of the positive monoflop in operative connection via the second changeover switch with the second trigger input of the negative monoflop and the output of negative monoflop in operative connection via the first changeover switch with the second trigger input of the positive monoflop.

5. Circuit according to claim 1, wherein the positive and negative monoflops have the same operating times which determine an upper limit of the bandwidth.

6. Circuit according to claim 2, wherein the positive and negative monoflops have the same operating times which determine an upper limit of the bandwidth.

7. Circuit according to claim 3, wherein the positive and negative monoflops have the same operating times which determine an upper limit of the bandwidth.

8. Circuit according to claim 4, wherein the positive and negative monoflops have the same operating times which determine an upper limit of the bandwidth.

9. Circuit according to claim 2, wherein said retriggerable monoflop has an operating time which is greater than an operating times of said positive and negative monoflops and determines the lower limit of the bandwidth.

10. Circuit according to claim 3, wherein the first and second inverting delay circuits have delay times which are the same.

11. Circuit according to claim 4, wherein the first through fourth delay circuits have delay times which are the same.

* * * * *